United States Patent [19]

Addiego et al.

[11] Patent Number: 5,164,565
[45] Date of Patent: Nov. 17, 1992

[54] LASER-BASED SYSTEM FOR MATERIAL DEPOSITION AND REMOVAL

[75] Inventors: Ginetto Addiego, Berkeley; Francois J. Henley, Los Gatos, both of Calif.

[73] Assignee: Photon Dynamics, Inc., Milpitas, Calif.

[21] Appl. No.: 687,473

[22] Filed: Apr. 18, 1991

[51] Int. Cl.$^5$ ............................................. B23K 26/00
[52] U.S. Cl. .............................. 219/121.68; 219/121.6;
219/121.76; 219/121.83; 219/121.84;
219/121.85
[58] Field of Search ...................... 219/121.68, 121.69,
219/121.6, 121.85, 121.76, 121.83, 121.82,
121.73, 121.84, 121.66; 427/53.1

[56] References Cited

U.S. PATENT DOCUMENTS

| | | | |
|---|---|---|---|
| 4,444,801 | 4/1984 | Hongo et al. | 427/10 |
| 4,463,073 | 7/1984 | Miyauchi et al. | 430/5 |
| 4,510,222 | 4/1985 | Okunaka et al. | 430/5 |
| 4,636,403 | 1/1987 | Fisanick et al. | 427/53.1 |
| 4,727,234 | 2/1988 | Oprysko et al. | 219/121.6 |
| 4,778,693 | 10/1988 | Drozdowicz et al. | 219/121.83 X |
| 5,017,755 | 5/1991 | Yahagi et al. | 219/121.68 |

Primary Examiner—C. L. Albritton
Attorney, Agent, or Firm—Townsend and Townsend

[57] ABSTRACT

A laser-based repair system provides for material removal and deposition using a repair tool having a first laser operating at a high power for cutting signal lines and operating at a lower power for ablating a target repair area in conjunction with a liquid dispensing apparatus for application of the liquid solution in a target area, and a second laser for decomposing the liquid solution in an applied layer prior to the ablation of material in the target repair area. Various repair processes can be undertaken. The invention allows high-speed material deposition and removal on a surface. In a specific embodiment of the invention, the liquid solution used is a palladium acetate and a solvent or other metallo-organic solution which is capable of pyrolytic reaction and decomposition to an electrically conductive residue. A liquid applicator or dispensing apparatus is provided which is suited to applying fine traces of liquid without clogging. An optical head is provided which project beams from a plurality of lasers and surface illumination along a common axis with an optical viewing system for lighting a target workpiece for observing the repair in progress. The invention is particularly useful in the repair of large matrices, such as liquid crystal display panels.

15 Claims, 7 Drawing Sheets

LASER-BASED SYSTEM FOR MATERIAL DEPOSITION AND REMOVAL

BACKGROUND OF THE INVENTION

This invention relates to the non-contact repair of microcircuits and in particular to the repair of simple and active matrix liquid crystal display panels, printed circuit boards, hybrid integrated circuits, and multiple-chip modules.

Manufacture of the aforementioned devices is complicated by the high number of microcircuits on each device. For example, an active matrix liquid crystal display panel may have over 1,000,000 thin-film transistors having a process area as high as 350 $cm^2$. This creates a formidable yield problem even for VLSI and ULSI manufacturing techniques. For example, a typical yield of shipped panels of high density active matrix LCD is only 10%. Repairing defective locations on the LCD panel can significantly increase the yield of such panels.

One system used in the repair of LCD panels is the Micrion L1 manufactured by Micrion Corporation of Massachusetts. The Micrion L1 system is capable of cutting through metal lines and depositing metal on the surface of an LCD panel. Thus, the Micrion L1 system may be used to repair a line-to-line (adjacent line) short. To repair the short, a laser is used to cut the conductive path in order to separate the traces. Although the Micrion system can repair a line-to-line short, use of the Micrion system is limited. The Micrion system cannot correct an open defect or perform a cross-short repair since it is unable to selectively remove a passivation layer. The inability to correct open defect and perform cross-short repairs limits the ability of the Micrion system to increase LCD panel yield.

Another limitation of the Micrion system is its high equipment complexity. The Micrion system uses a deposition technology based on a photolytic process. In operation, an LCD panel is placed within a vacuum chamber. Gas is introduced into the chamber and the gas is photolytically decomposed by a laser, forming metal on the workpiece surface. Sustaining this gaseous environment increases equipment complexity since the system must support a vacuum system as well as a toxic gas delivery, venting, and management system. Furthermore, the metal deposition process of the system is very slow, having a writing speed of approximately 1 micrometer per second. The equipment is therefore of limited use in high volume manufacture and repair due to its lack of throughput and the need for operator control.

Theoretically open defect, cross-short, and line-to-line short repairs of an LCD panel could be performed by moving the panel through a series of repair systems currently available. However, such processing would be extremely cumbersome ,and expensive. First, the protective passivation layer would be removed by a first laser. Next, the LCD panel would be manually moved to a dispensing system where a metallo-organic fluid would be applied. After the LCD panel is allowed to dry, the panel would be manually moved to a second laser system to decompose the metallo-organic material into a pure metal.

Unfortunately, current dispensing systems are inadequate for the uniform and semiautomatic deposition of highly volatile low viscosity metallo-organic fluid used in repair such as palladium acetate in a solvent base. It is very difficult to dispense a volatile material with a very low viscosity. Attempts to air brush or air spray such a material on an LCD panel results in significant drying before contact with the panel surface. Research in the field of ink deposition, painting, brushing, and even photoresist spinning, has not resulted in a successful semiautomatic method for the localized application of a controlled width and thickness of a highly volatile material. Micropen Corporation has introduced an active feedback system for dispensing fluid over a workpiece surface. However, the Micropen system is inadequate to dispense a uniform thickness of a low viscosity fluid since it uses the fluid backpressure to set the height of the dispensing nozzle. Because of the low viscosity of the metallo-organic fluid, there is insufficient backpressure for the Micropen system to function in the environment of interest herein. The Micropen system relies on the use of a highly viscous fluid.

Another problem in current dispensing systems is contact to the workpiece surface. Since surface contact of a repair system to the workpiece can result in damage to or the destruction of the workpiece, the repair system must not contact the workpiece. Therefore, some kind of hovering device is necessary. Current hovering devices are not useful. For example, a capacitance feedback hovering system would fail since the capacitance measuring device would collapse by not having a ground plate on one side.

Current repair systems are unable to significantly increase LCD panel yield since they cannot selectively remove passivation layers and therefore cannot perform open defect and cross-short repairs. Furthermore, current systems which use gas deposition to form metal line are slow and rely on highly complex manufacturing equipment.

A repair process which would rely on transferring an LCD panel through a series of repair systems would require that the user buy and maintain three different systems to perform open defect and cross-short repairs. Transfer of the LCD panel between such systems would increase the probability of breakage, loss and contamination of the workpiece. Furthermore, an adequate dispensing system does not exist for the semiautomatic dispensation of a metallo-organic fluid. There is therefore a need in the industry for semiautomatic repair of liquid crystal display panels, PC boards, multi-chip modules, and the like.

SUMMARY OF THE INVENTION

According to the invention, a laser-based field repair system provides for material removal by a repair tool comprising: a first laser operating at a high power for cutting signal lines and operating at a lower power for ablating a target area, a liquid dispensing apparatus for application of a liquid solution in a target area, and a second laser for decomposing the liquid solution in an applied layer prior to the ablation of material in the target area. The invention allows high-speed material deposition and removal on a workpiece surface. The workpiece is mounted on a housing having translation stages adapted for placement of the workpiece relative to the repair tools within three dimensions. An optical system is provided which projects beams from a plurality of lasers and provides surface illumination along a common axis with an optical viewing system for aligning the target workpiece and for observing repair work in progress. A liquid applicator or dispensing apparatus is provided which is suited to applying fine traces of liquid without clogging.

In a specific embodiment of the invention, the liquid solution used is palladium acetate in a solvent or other metallo-organic fluid which is capable of pyrolytic reaction and decomposition to an electrically conductive residue. When the metallo-organic fluid is applied as a thin film, decomposition creates lines of conductive material which has very good adhesion to an underlying layer. These lines of conductive material are suitable to effect repairs of broken conductive traces.

The invention is particularly useful in the repair of large arrays, such as active matrix liquid crystal display panels. The invention allows for application of a film, laser cutting, laser controlled ablation, and laser controlled deposition capability within a single system. Because the system performs controlled laser ablation, the system allows for controlled removal of passivation layers. Therefore the present system can perform open defect and cross-short repairs on an LCD panel. By increasing the number of repairs on the panel, yield is improved. Increasing yield means lower total equipment cost and therefore lower capital investment for liquid crystal display manufacturing facilities.

The invention will be better understood upon reference to the following detailed description in connection with the accompanying drawings.

DESCRIPTION OF SPECIFIC EMBODIMENTS

Figure 1:
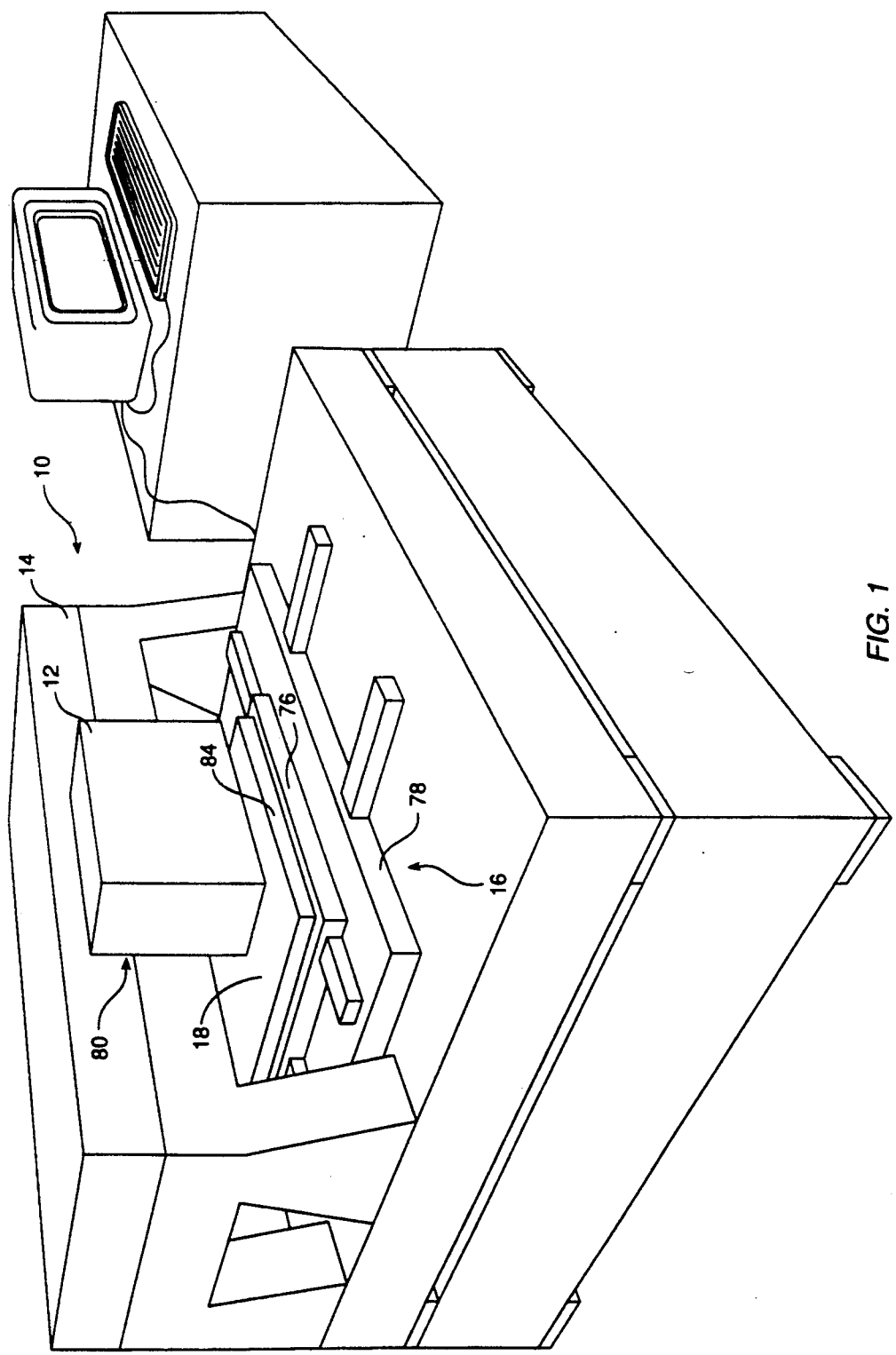
FIG. 1 is a perspective view of an apparatus according to the invention.

FIG. 1 illustrates a laser inspection and repair system 10 in accordance with the present invention. The repair system 10 comprises a dispensing system 12 for applying a film, an optical system 14 for combining the beams of a first laser 20 and second laser 22 with the optics of a viewing system 28, and a workpiece placement system 16. The first laser 20, second laser 22 and optics of the viewing system 28 are contained within the optical system 14. The inspection and repair system 10 selectively cuts, removes, and applies materials to the workpiece 18.

The Optical System

Figure 5:
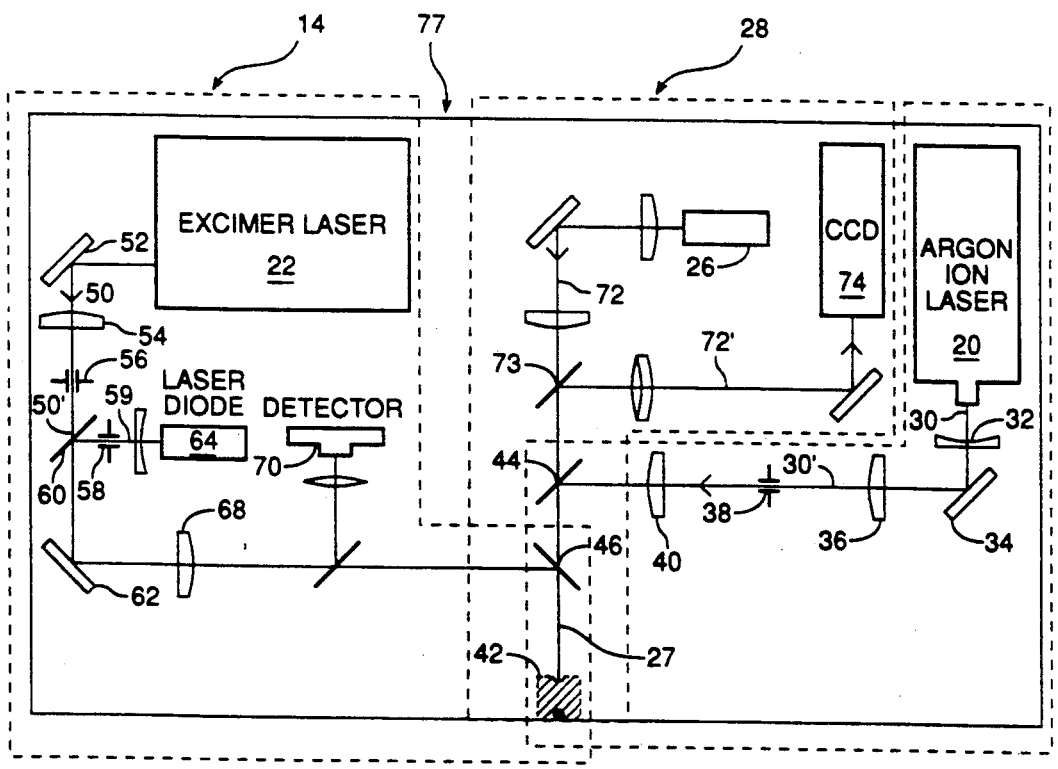
FIG. 5 is a schematic diagram of an optical system in an apparatus according to the invention.

FIG. 5 illustrates a specific embodiment of the optical system according to the present invention. In the present invention, the optical system 14 combines the beams from an argon-ion laser 20, an excimer laser 22, and the light from a viewing light source 26 along a common axis 27. The combined light beam is used for aligning the target area of the workpiece 18 and for observing the repair in progress. The excimer laser 22 is used for the cutting and ablating of materials in the target area on the workpiece 18 surface (FIG. 1). The excimer laser 22 emits periodic energy pulses at for example 193 nm, 248 nm, and 308 nm wavelengths. Typically, a high energy pulse is used for cutting on the workpiece and a low energy pulse is used for ablation. The argon-ion laser 20 emits a continuous energy at wavelengths of 457 through 514 nanometers. The argon-ion laser 20 is used to decompose the metallo-organic material into a pure metal.

Referring to FIG. 5, the argon-ion beam 30 is directed through a first negative lens 32 which is used to increase beam divergence in order to help fill the aperture of the objective lens system 42. After expansion, the laser beam 30 is reflected from mirror 34 which changes the original beam path by 90°. The beam 30 thus reflected is directed through a relay lens 36 which provides flexibility of image quality adjustment due to the laser beam profile variation from laser to laser. The beam 30 then passes through a first aperture 38 which is used to shape the laser beam 30 into a shape which is generally a top hat in cross-section. This top hat shaped beam is of substantially constant intensity and has sharp boundaries. To improve intensity uniformity and efficiency of the laser beam a multi-mode argon-ion laser should be used. The top hat shaped argon-ion laser beam 30' is then directed through a third lens 40. The third lens 40 and the objective lens set 42 are the imaging lenses of the repair system 10. Together they image the aperture to the substrate plane with the desired magnification ratio.

The excimer laser 22 is used in one mode for controlled ablation. For example, it can be used to controllably remove a passivation layer or to cut a metal line. In operation, the excimer laser 22 emits an ultra-violet beam 50 which is reflected from mirror 52 to change the original beam path by 90 ° so that the laser beam 50 passes through a relay lens 54. The relay lens 54 is used to provide flexibility of image quality adjustment. The excimer laser beam 50 passes through a second aperture 56 which is used to shape the excimer laser beam 50 into a beam which is generally a top hat in cross-section. The shaped beam has a substantially constant intensity and sharp boundaries and is approximately 5 μm×5 μm in cross section at the workpiece surface. This top hat shaped laser beam 50' creates a laser beam intensity profile which will allow control of the ablation area easily by a simple adjustment of laser power. The excimer laser beam 50' is reflected off a mirror 62 and is passed through a lens 68. Together the lens 68 and the objective lens 42 are used to form the imaging lenses which image the aperture to the wafer plane the desired magnification ratio. A photodetector 70 is used to monitor laser beam intensity.

A laser diode 64 in the visible light range at 670 nanometers is provided to perform the alignment of the excimer laser 22. When the excimer laser 22 is operating. an alignment beam 59 is directed coaxially along the path of the excimer laser beam 50' by a beam splitter 60. The laser diode 64 emits a continuous beam in the visible light spectrum which travels coincident with the excimer laser beam 50' into the viewing system 28. A third aperture 58 narrows the alignment beam to the same size as the excimer beam at the workpiece surface.

A beam splitter 44 combines the argon-ion laser beam 30' with the illumination beam from source 26 and is directed towards the objective lens 42. A beam splitter 46 adds the excimer laser beam 50' along the optical system axis 27 towards the objective lens 42. The optical viewing system 28 combines the beams of the argon-ion laser 30', the excimer laser beam 50' with its alignment beam 59, and the light from the source 26 along the common axis 27 in the optical viewing system 28. The combined light source along the common axis 27 in the optical viewing system 28 is used for aligning the combined light beam with the target area of the workpiece 18 and for observing the repair in progress.

The viewing system 28 includes white light source 26 which provides uniform illumination on the workpiece and a video camera 74. The light source power is adjustable to accommodate workpiece reflection variation. The camera 74 is connected to a television monitor (not shown) so that the laser beams may be viewed by a human operator.

The laser beam 30' from the argon-ion laser 20, the excimer laser beam 50', and the light beam 72 all combine along the optical system axis 27 and enter into the objective lens set 42. The objective lens set 42 is a Cassagrain reflective lens. Although the three different light sources have different wavelengths, the Cassagrain reflective lens operates so that the three different wavelengths of the aforementioned beams have the same focal length in the operating range of 193 to 800 nanometers. The elements of the optical system 14 are mounted to an optics plate 77 (FIG. 1) for stability. This prevents movement of the camera, lenses and other relational items, thus increasing the probability of a clear and focused picture of the workpiece target area.

The Workpiece Placement System

Referring to FIG. 1, the workpiece 18 (not shown in FIG. 1) is mounted on a housing having translations stages 76, 78, 80 adapted for placement of the workpiece 18 relative to the repair tools within three dimensions. A first X stage 76 adjusts workpiece movement in the X direction. A second Y stage 78 adjusts the movement of the workpiece 18 in the Y direction. A third Z stage 80 adjusts the movement of the optical viewing system 28 in relation to the workpiece 18 in the Z direction.

The X stage 76 and the Y stage 78 are rectangular platforms having a surface measurement of approximately 450 mm ×450 mm. Both the X stage 76 and Y stage 78 have a range of motion of approximately 525 mm from a point of origin. The Z stage 80 is a rectangular platform with a surface dimension of approximately 150 mm×50 mm. The Z stage 80 has a range of motion approximately 50 mm from a point of origin. The Z stage 80 is mounted to the optical plate 77 and is used for focusing the optical system 14.

The workpiece 18 sits on top of a vacuum chuck stage 84 which allows a slight downward pressure to keep the workpiece 18 in place during repair operation. Internal to the vacuum chuck stage 84 is a series of resistors. When power is applied to the repair system, these resistors release energy in the form of heat. This heat warms the vacuum chuck 84 which in turn heats and dries the workpiece 18. The Y translation stage 78 is underneath the vacuum chuck 84. The X translation stage 76 is beneath the Y translation stage 78.

Movement of the workpiece 18 may be made by a human operator or by a computer created "repair file", which effects motion through an appropriate gearing system. The imaging information system generates data as a repair file which identifies the location and type of each defect. The repair file allows the computer to automatically position the laser in the vicinity of the workpiece defect.

The Dispensing System

Figure 2:
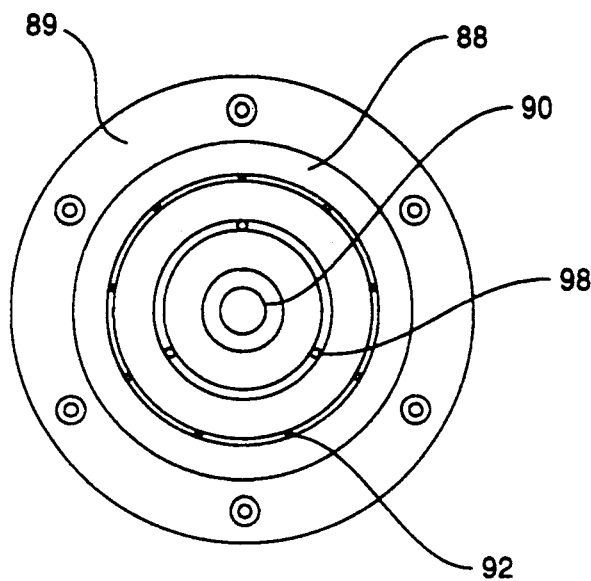
FIG. 2 is a bottom plan view in partial cross-section of the bearing face of a dispensing apparatus according to the invention.
Figure 3:
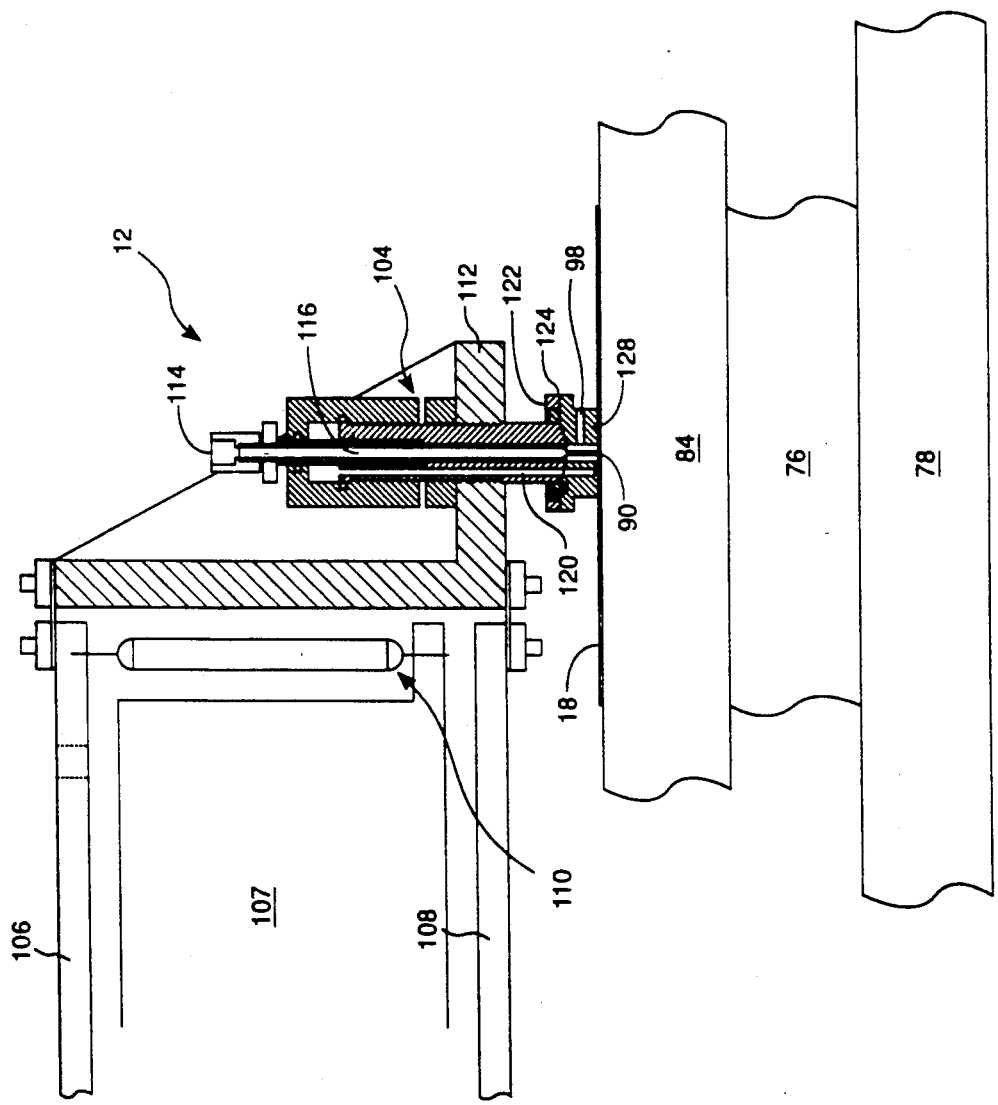
FIG. 3 is a side elevational view in partial cross-section of the dispensing apparatus and work surface according to the invention.
Figure 4:
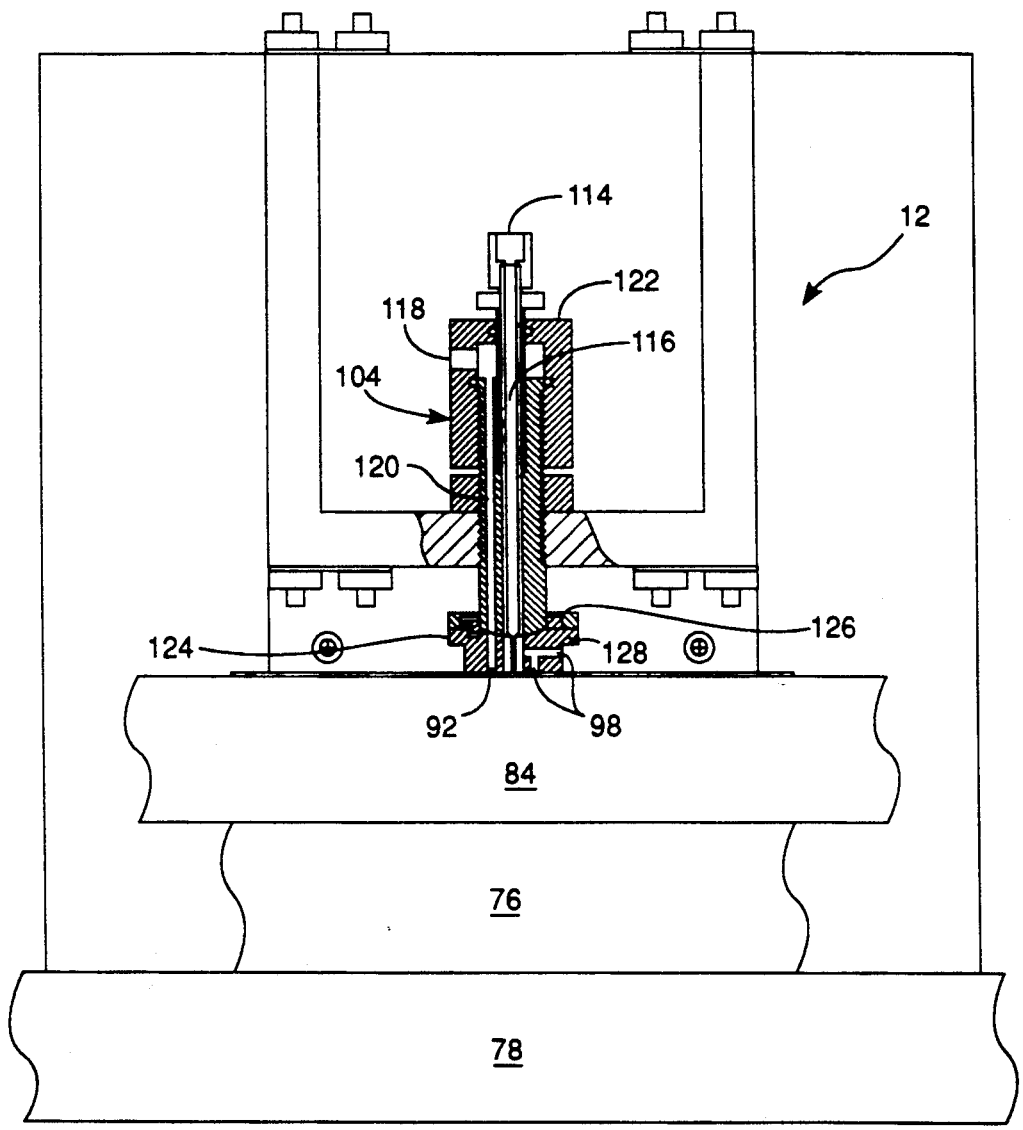
FIG. 4 is a front plan view in partial cross-section of the dispensing apparatus according to the invention.

A dispensing system 12 is illustrated in FIGS. 2, 3 and 4. The dispensing system 12 provides a non-contact, semiautomatic apparatus for high speed surface deposition of a low viscosity fluid to a localized region. An air bearing is used to establish constant and precise spacing between the workpiece 18 and a bearing face 88 of the dispenser manifold 104.

FIG. 2 shows a cross-sectional view of the bearing face 88 of the dispenser manifold 104. The center circular orifice 90 is an outlet for dispensation of the metallo-organic fluid. The fluid outlet 90 is positioned at the center of the bearing face 88 and is approximately 0.2 mm in diameter. The bearing face 88 is surrounded by a circular lip 89 which attaches the bearing face 88 to the dispenser manifold 104. There is a step between the bearing face 88 and the circular lip 89 so that the bearing face 88 and lip 89 are not in the same plane. The circular lip 89 is approximately 28 mm in diameter. The bearing face 88 is approximately 20 mm in diameter.

The twelve circular orifices 92 and 98 control air flow from the bearing face 88. The nine outer orifices 92 are air jets which expel air fed into the dispenser manifold 104 by the air inlet 118. Each of the nine air jets 92 are approximately 0.5 mm in diameter and is positioned at a common radius from the center of the fluid outlet 90. Each of the air jets 92 is positioned at a 40° spacing from the other air jets. The three inner orifices 98 are air vents approximately 1 mm in diameter all of which are positioned at a common radius from the center of the bearing face 88. Each of the air vents 98, is positioned at 120° spacing from the other two air vents. Excess air escaping outwardly from the air jets 92, may be expelled through the air vents 98. The air vents 98 extend from the bearing face 88 to the side of the dispenser manifold 104. Because excess air is expended through the air vents 98, no excess air travels to the fluid outlet nozzle 90.

FIG. 3 shows a side view of the dispensing system 12. Two side bars 106, 108 support the dispenser manifold 104. The sidebar arms 106, 108 and support beam 107 are mounted to the optics plate 77. The support beam 107 applies tension to a spring 110 creating a downward force when the dispensing system 12 is in use. This downward force is counteracted by the backpressure force created by air jets through outlets 92. When the dispensing system 12 is not in use, a cam (not shown) raises the sidebar arm 106 so that the dispensing system 12 is not in contact with the workpiece 18. The dispensing system 12 further comprises an L-shaped support beam 112 which is connected to the sidebar arms 106, 108. The L-shaped support beam 112 supports the dispenser manifold 104. The dispenser manifold 104 is mounted in the L-shaped support beam 112 by screwing the dispenser manifold 104 into the L-shaped beam 112.

The dispenser manifold 104 is columnar in form and consists of at least two pathways for air and fluid flow. A first pathway extends from the fluid inlet 114 to the fluid outlet 90 at the bearing face 88 of the dispenser manifold 104. Fluid enters the fluid inlet 114 at the top of the dispenser manifold 104 through a tube connected to the top of the dispenser manifold. The tube is connected to a positive displacement pump (not shown) which pumps a constant volume of the metallo-organic solution into the dispenser manifold 104 at the desired rate. The metallo-organic compound travels from the fluid inlet 114 down the fluid column 116 towards the fluid outlet 90 located at the bearing face 88.

Compressed air enters the dispenser manifold 104 through a side air inlet 118. Air is forced out of air outlets 92 and excess air is vented out through the air vents 98. The dispenser manifold 104 is sealed by an 0 ring which prevents air from escaping from any area of the dispensing manifold 104 except the air outlets 92.

The air bearing is used to establish the spacing between the workpiece 18 and the bearing face 88. In order to make the air bearing self-leveling with the workpiece 18, a spherical joint 124 is disposed between the upper region of the dispenser manifold 126 and the lower region dispenser manifold 128. The uppermost region of the dispenser manifold 126 is stationary and has a convex face. The concave face of the upper dispenser manifold 126 is matched to the convex face of the lower dispenser manifold 128. The lower dispenser manifold 128 is movable. Slight movements of the lower dispenser manifold 128 along the spherical joint 124 allow the two members to remain level with the workpiece 18. Movement of the lower dispenser manifold 128 allows the system to equalize the pressure underneath the bearing face 88, thus equalizing the height of the bearing face 88 in relation to the workpiece 18.

Repair Operation

Figure 6:
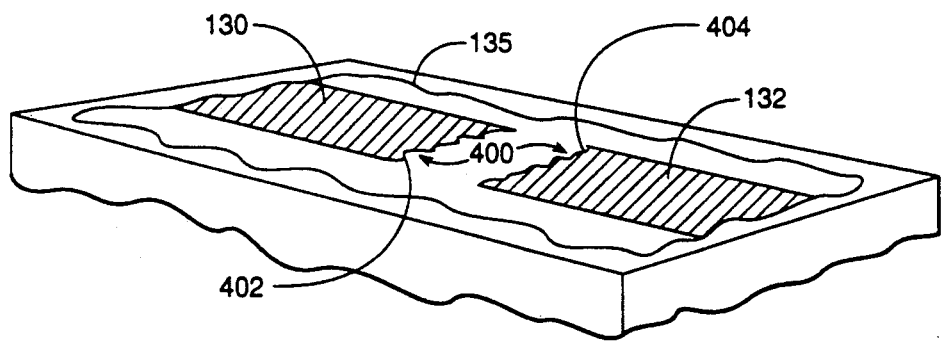
FIG. 6 is a perspective view of a first structure having a first type of (open) defect.
Figure 8:
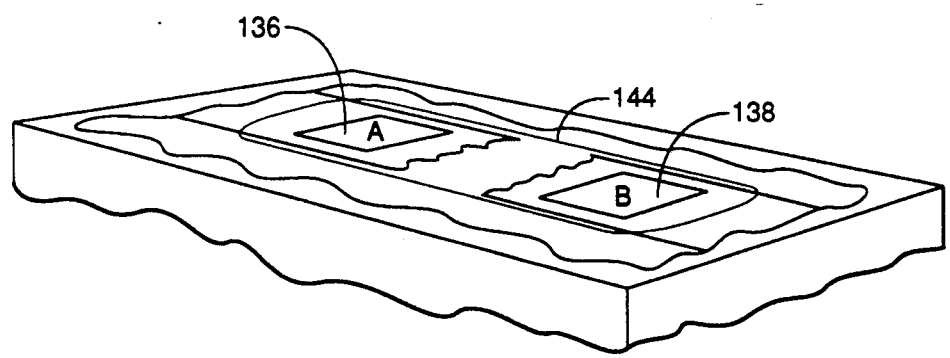
FIG. 8 is a perspective view of a first structure after the dispensing step according to the invention.
Figure 9:
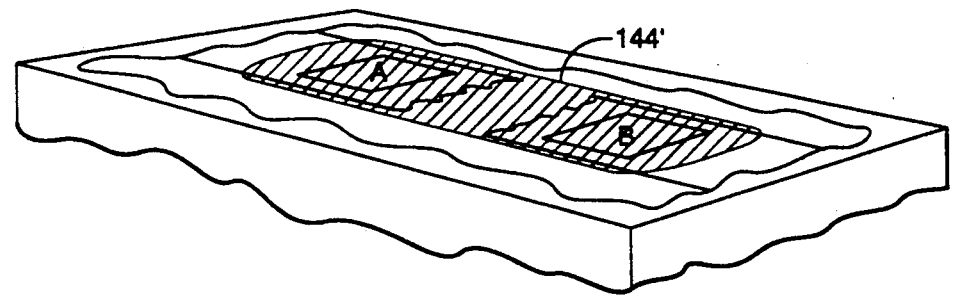
FIG. 9 is a perspective view of a first structure after the irradiating step according to the invention.
Figure 10:
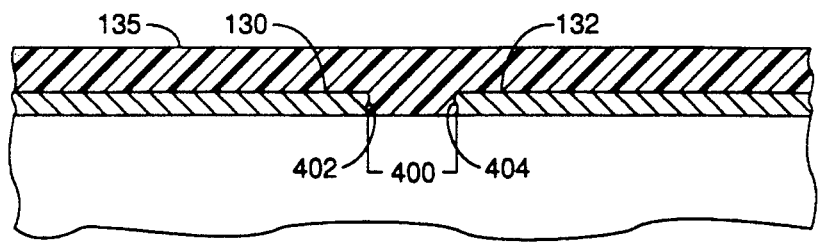
FIG. 10 is a side cross-sectional view of a first structure having a first defect.

In operation, the repair system 10 utilizes the dispensing system 12, the optical system 14, and the workpiece placement system 16 in order to selectively cut, remove, and apply materials to the workpiece surface. A typical application of the repair system 10 is the repair of a defect in a metal trace which is open and not connected. FIGS. 6–15 shows steps in defect repair. In FIG. 6, there is a gap 400 between the two ends of the metal trace portions 130 and 132 so that no electrical connection exists. FIG. 10 shows a cross-sectional view of this defect under a passivation layer 135.

Figure 7:
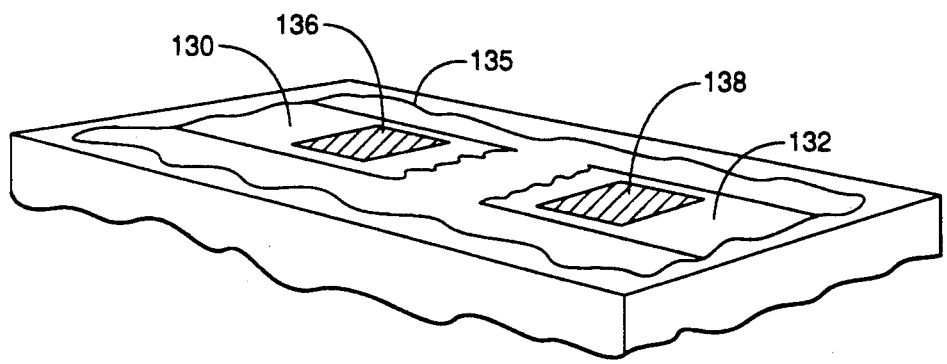
FIG. 7 is a perspective open view of a first structure after the extrication step according to the invention.
Figure 11:
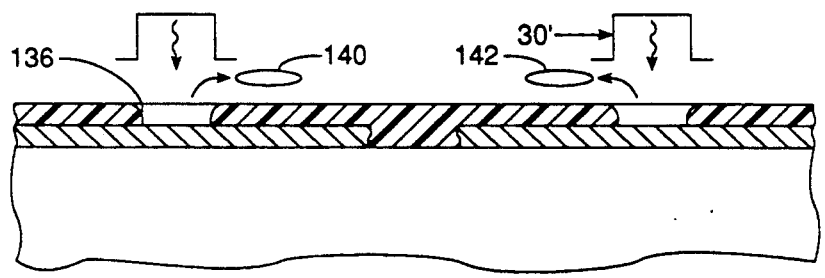
FIG. 11 is a side cross-sectional view of a first structure illustrating the extrication step according to the invention.
Figure 12:
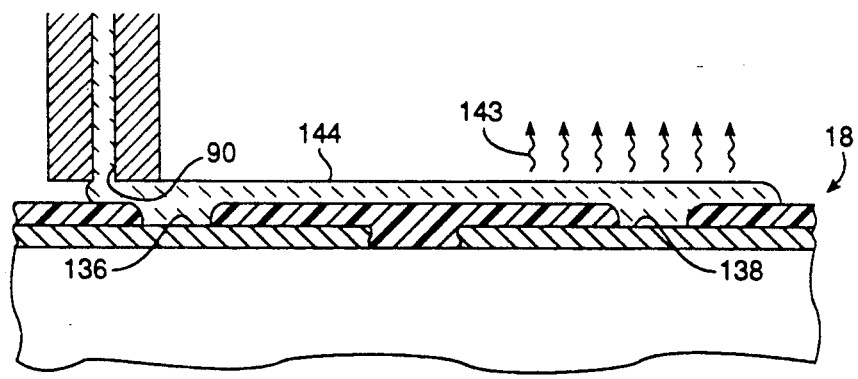
FIG. 12 is a side cross-sectional view of a first structure illustrating the dispensing step according to the invention.

In order to repair the workpiece 18, the two metal traces portions 130, 132 must be connected. In the defect illustrated in FIGS. 6 and 10, a passivation layer 135 exists over the metal trace 130, 132 to b Ⓡ connected. The first step in the repair is the ablation of the passivation layer 135 to open contact areas 136, 138 over the metal trace portions 130, 132. The excimer laser 22 can accurately ablate selected portions 140, 142 of the passivation layer 135 without disturbing the metal underneath. The excimer laser beam in top hat cross section 30' emits low energy pulses to the passivation layer 135 slowly breaking down until completely removing the passivation layer and leaving the metal intact. FIG. 7 illustrates a perspective view of the workpiece after laser removal of the passivation layer. FIG. 11 illustrates a cross-sectional view of the workpiece after the excimer laser has removed the passivation layer.

The next step in the repair operation is to dispense a metallo-organic solution 144 over the target area so that it encapsulates both exposed metal areas at position A (136) and position B (138). The region should be free of any impurities, of passivation, or of oxide which might hinder contact between the metal and the dispensed metallo-organic solution. FIG. 8 illustrates the perspective view of the target area after the metallo-organic material has been dispensed over the target area. FIG. 11 illustrates a cross-sectional view as fluid is being dispensed over the target area. The fluid dispensed is typically solvent-based with a metallo-organic compound as the active ingredient. Although other acetates could be used, the active ingredient in the preferred embodiment is palladium acetate. Palladium acetate has good electrical characteristics when decomposed into pure Palladium. A minute amount of a titanium resinate may be added to promote the adhesion of the metal to the passivation layer.

The dispensing system 12 provides a non-contact, semiautomatic apparatus for high speed surface deposition of low viscosity fluid to a localized area. An air bearing formed by bearing face 88 is used to establish the spacing between the workpiece 18 and the bearing face 88 of the dispensing system 12. The distance in the preferred embodiment of the present invention between the bearing face 88 and workpiece 18 is about 30 micrometers in height.

The fluid outlet nozzle 90 dispenses liquid in an area approximately equal to the diameter of the injector outlet 90. Injector size may vary, however. Typical injector sizes range from 200 micrometers to a millimeter diameter size. If the volume flow rate of the liquid is adjusted to match the amount of liquid needed to dispense, there is no spreading, bleeding or starving of the liquid as it is applied. The fluid outlet 90 typically has a very flat nozzle. In the preferred embodiment, a sapphire jewel bead is used to create a flat nozzle surface. The bearing face 88 of the dispenser manifold 104 acts as a doctor blade so that as liquid is dispensed from the fluid outlet 90, the XY stage moves and the bearing face 88 causes the liquid to essentially peel away from the edge of the fluid outlet nozzle 90 leaving 30 micrometers of liquid.

An embodiment of the present invention may utilize a fluid outlet 90 with a round blade or face to apply a swath of liquid that is equal in diameter to the fluid outlet 90. In the preferred embodiment, the swath of liquid is not circular but linear. The swath width is made large enough so that the drying process in the center is vertical because there is an equal amount of liquid on each side. On the sides of the swath, however, there is some lateral drying so that the liquid does not dry evenly on the sides. This problem is ameliorated by targeting the applicator to the center of the target region where the repair is to be performed. For example, if the repair needs only be 10 micrometers in width, the liquid swath would be 200 microns in width. This leaves a significant zone of liquid which is not written on by the laser. A second portion of the "sweet spot" of the swath creates a significant lateral and longitudinal width along the swath for repair.

After dispensing the metallo-organic solution, the next step in the repair process is the decomposition of the metallo-organic compound by writing with the argon-ion laser beam 50. The metallo-organic material should be dry before the decomposition step occurs. In order to speed up the drying process, heating elements are incorporated in the wafer chuck 84. The wafer chuck 84 is preheated to 60° C. by the internal heating elements. A temperature of 60° C. works well for the metallo-organic material palladium acetate, but a different temperature range may be necessary for other metallo-organic compounds. The heating of the workpiece causes the metallo-organic compound to dry quickly and therefore leave a film that can be very quickly written over. This increases workpiece 18 throughput.

Figure 13:
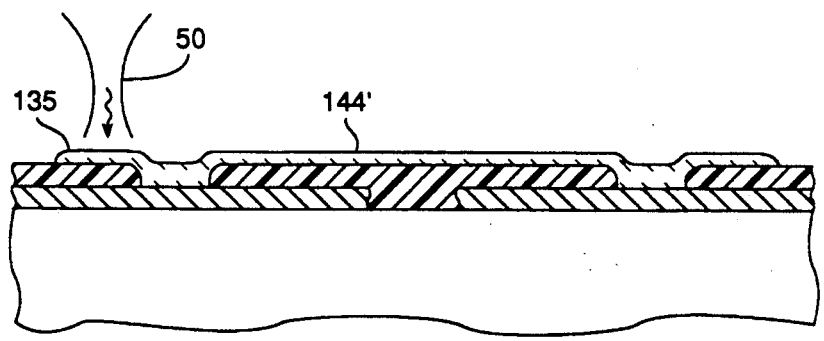
FIG. 13 is a side cross-sectional view of a first structure illustrating the irradiating step according to the invention.
Figure 14:
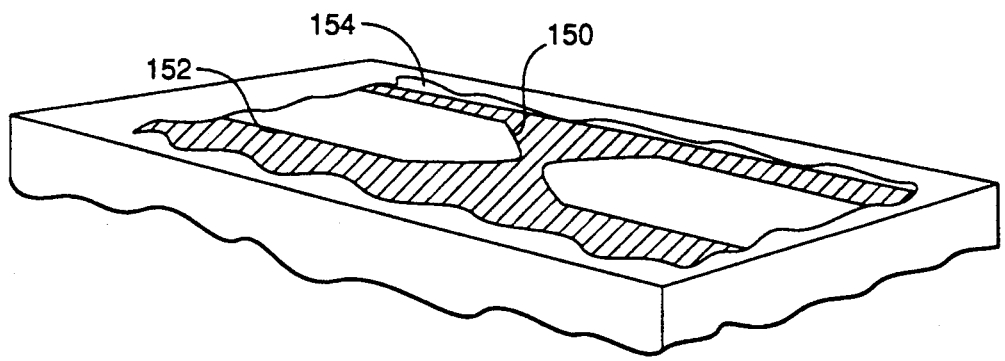
FIG. 14 is a perspective view of a second structure having a second defect.
Figure 15:
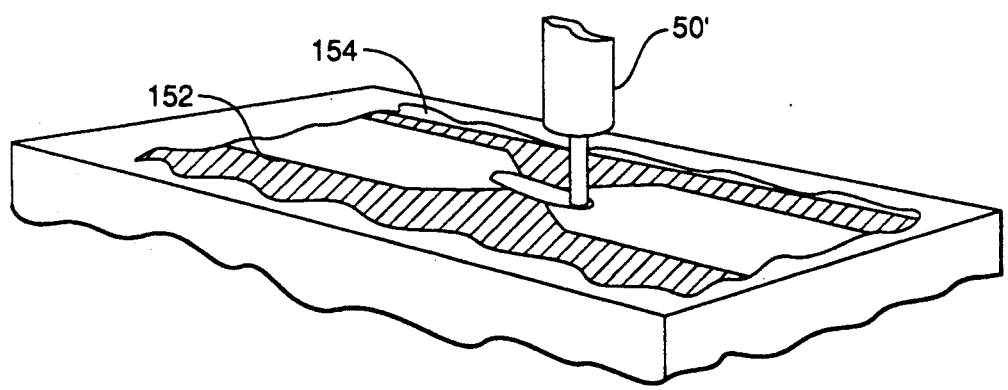
FIG. 15 is a perspective view of a second invention illustrating a cutting step according to the invention.

After the metallo-organic material is sufficiently dry, the argon-ion laser beam 30 is positioned over contact position B or its vicinity. Application of the laser beam 30 to the metallo-organic compound decomposes the compound to form pure metal. FIG. 9 is a perspective view after the laser irradiation of the workpiece 18. FIG. 13 is a cross-sectional view illustrating the irradiation of the workpiece 18 by the laser beam. The XY stage of the workpiece placement system 16 moves the workpiece 18 from contact position B to contact position A, essentially drawing a metal connecting line 144' from position B to position A with the argon ion laser beam 30. After the metal connecting layer is formed the unwritten film of the metallo-organic compound is removed by chemically dissolving the remaining compound This is typically done by using a vapor phase isopropyl alcohol cleaning process, which is standard in the liquid crystal display panel industry. Electrical continuity is established between region 138 and region 136 through the passivation layer 135. Other repairs can also be performed. For example, referring to FIG. 16, a line-to-line or adjacent trace short 150 between metal traces 152, 154 can be removed by ablation with a laser beam 50' (FIG. 17) whereby the excess material is cut out.

As will be understood by those familiar with the art, the present invention may be embodied in other specific forms without departing from the spirit or essential character thereof. For example, the repair system could use an automated alignment system for optical system alignment. Accordingly, the disclosure of the preferred embodiment of the invention is intended to be illustrative, but not limiting, to the scope of the invention which is set forth in the following claims.

What is claimed is:

1. A laser repair system for microcircuit repair by material deposition and removal comprising:
   a) a first laser for cutting and ablating target areas in a workpiece;
   b) a dispensing means for applying a metallo-organic liquid solution to said target areas;
   c) a second laser for decomposing said liquid solution to a conductive metal including in said target areas;
   d) an optical means for combining beams of said first laser and said second laser along a common axis; and
   e) a workpiece placement means for moving said workpiece.

2. The laser repair system as recited in claim 1 wherein said first laser is an excimer laser.

3. The laser repair system as recited in claim 1 wherein said second laser is an argon-ion laser.

4. The laser repair system as recited in claim 1 wherein said dispensing means includes means for establishing an air bearing for maintaining a controlled distance between said dispensing means and said workpiece so that said dispensing means avoids contact with said workpiece.

5. The laser repair system as recited in claim 4 wherein said dispensing means has a bearing face and includes an air outlet and a liquid solution outlet in said bearing face.

6. The laser repair system as recited in claim 5 wherein the bearing face forms a doctor blade for shearing said liquid solution.

7. The laser repair system as recited in claim 1 further comprising a viewing system in said optical means for observing said workpiece.

8. The laser repair system as recited in claim 7 wherein said optical means includes means for illuminating said workpiece and for observing said workpiece along said common axis with said laser beams.

9. The laser repair system as recited in claim 1 further including heating elements placed in said workpiece placement means for accelerating drying time of said workpiece.

10. The laser repair system as recited in claim 1 further including means for shaping the beam of said first laser and the beam of said second laser into top hat-shaped intensity cross sections.

11. A method for opening a via in a passivation layer having an interface upon a metal layer of a circuit structure constructed upon a substrate in order to expose said metal layer to allow contact of a signal conduction overlay with said metal layer, said method comprising the steps of:
   a) generating a beam in pulses from an excimer laser with sufficient energy such that upon injection of at least one pulse of said beam into said passivation layer said interface upon said metal layer will break down;
   b) shaping said beam to define a cross-sectional area with substantially constant intensity and sharp boundaries in the form of a top hat;
   c) injecting said top hat-shaped beam into said passivation layer at a target area for a sufficient duration and a sufficient number of times to cause said interface to break down; and
   d) removing said passivation layer in the target area to define said via.

12. The method according to claim 11 wherein said removing step comprises:
   vaporizing said passivation layer in said target area with said top hat-shaped beam.

13. The method according to claim 11 wherein said removing step comprises:
   exploding said interface between said conduction layer and said passivation layer in said target area to leaving an unconnected residue of said passivation layer; and
   extricating said unconnected residue from said passivation layer.

14. The method according to claim 13 wherein said extricating step comprises:
   vacuuming said unconnected residue from said passivation layer.

15. The method according to claim 13 wherein said extricating step comprises:
   blowing away said unconnected residue from said passivation layer.

* * * * *